United States Patent
Yamabana et al.

(10) Patent No.: US 8,183,934 B2
(45) Date of Patent: May 22, 2012

(54) PLL CIRCUIT AND VOLTAGE-CONTROLLED OSCILLATOR

(75) Inventors: Tetsuji Yamabana, Kawasaki (JP); Kouichi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 72 days.

(21) Appl. No.: 12/787,395

(22) Filed: May 26, 2010

(65) Prior Publication Data

US 2010/0315136 A1 Dec. 16, 2010

(30) Foreign Application Priority Data

Jun. 15, 2009 (JP) ................................. 2009-142362

(51) Int. Cl.
*H03L 7/06* (2006.01)
(52) U.S. Cl. ............................... 331/14; 331/10; 331/16
(58) Field of Classification Search ................... 331/10, 331/11, 14, 16
See application file for complete search history.

(56) References Cited

U.S. PATENT DOCUMENTS

| 7,323,943 | B2 | 1/2008 | Kaneko et al. | |
| 7,495,488 | B2 * | 2/2009 | Kim | 327/159 |

FOREIGN PATENT DOCUMENTS

| JP | 10-173520 A | 6/1998 |
| JP | 11-008551 A | 1/1999 |
| JP | 2006-157630 A | 6/2006 |
| JP | 2006-174358 A | 6/2006 |

* cited by examiner

*Primary Examiner* — James E Goodley
(74) *Attorney, Agent, or Firm* — Fujitsu Patent Center

(57) ABSTRACT

In a PLL circuit, a threshold discriminator generates a control signal indicating a relative level of a control voltage. A controller outputs a controlling value based on the control signal. If the control signal indicates a high level when the controlling value specifies a control voltage-to-oscillation frequency correspondence relation whose upper and lower limits of oscillation frequency are highest, and if the control signal indicates a low level when the controlling value specifies a correspondence relation whose upper and lower limits of oscillation frequency are lowest, the controller outputs a predetermined controlling value. An oscillator has the correspondence relations set therein such that the correspondence relations have respective different upper and lower limits of oscillation frequency and are correlated with the respective controlling values. The oscillator outputs a signal with the oscillation frequency corresponding to the control voltage and associated with the correspondence relation specified by the controlling value.

6 Claims, 9 Drawing Sheets

PLL CIRCUIT AND VOLTAGE-CONTROLLED OSCILLATOR

CROSS-REFERENCE TO RELATED APPLICATIONS

This application is based upon and claims the benefit of priority of the prior Japanese Patent Application No. 2009-142362, filed on Jun. 15, 2009, the entire contents of which are incorporated herein by reference.

FIELD

The embodiments discussed herein are related to PLL (Phase Locked Loop) circuits and methods of controlling PLL circuits.

BACKGROUND

A PLL circuit is a circuit wherein the oscillation frequency of a voltage-controlled oscillator is varied to adjust the phase so that the oscillation frequency may be locked at a target frequency. The PLL circuit occasionally falls into a state called deadlock due to, for example, a deviation between the operating frequency range of the voltage-controlled oscillator and that of the frequency divider. Such deadlock is caused due to disconnection of the loop in the PLL circuit when the frequency divider becomes unable to lock the output signal from the voltage-controlled oscillator.

The following techniques have been known as measures against the deadlock of a PLL circuit.

(see, e.g., Japanese Laid-open Patent Publication No. 2006-157630)

(see, e.g., Japanese Laid-open Patent Publication No. 11-8551)

(see, e.g., Japanese Laid-open Patent Publication No. 2006-174358)

(see, e.g., Japanese Laid-open Patent Publication No. 10-173520)

Japanese Laid-open Patent Publication No. 2006-157630 discloses a method of releasing a PLL circuit from deadlock. The technique disclosed in Japanese Laid-open Patent Publication No. 2006-157630 is based on the presupposition that when the PLL circuit is to be released from deadlock, the frequency-divided signal output from the frequency divider is fixed at a high or a low level. Depending on the operation of the frequency divider that failed to lock, however, the frequency-divided signal from the frequency divider in deadlock is not always fixed at a high or a low level, and in such case, a problem arises in that the frequency divider is unable to recover from the deadlock.

SUMMARY

According to one aspect of the present invention, a PLL circuit includes a control voltage generator configured to generate a control voltage in accordance with the phase difference between a phase of an output signal fed back thereto and a phase of an input reference signal, and a voltage-controlled oscillator configured to control an oscillation frequency of the output signal in accordance with the control voltage, wherein the voltage-controlled oscillator includes an oscillator configured to have plural sets of upper and lower limits of the oscillation frequency and a plurality of control voltage-to-oscillation frequency correspondence relations being correlated with a plurality of controlling values, respectively, the oscillator being configured to output the output signal with the oscillation frequency corresponding to the control voltage and associated with the correspondence relation specified by the controlling value, a threshold discriminator configured to generate a control signal indicating a relative level of the control voltage, and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Figure 1:
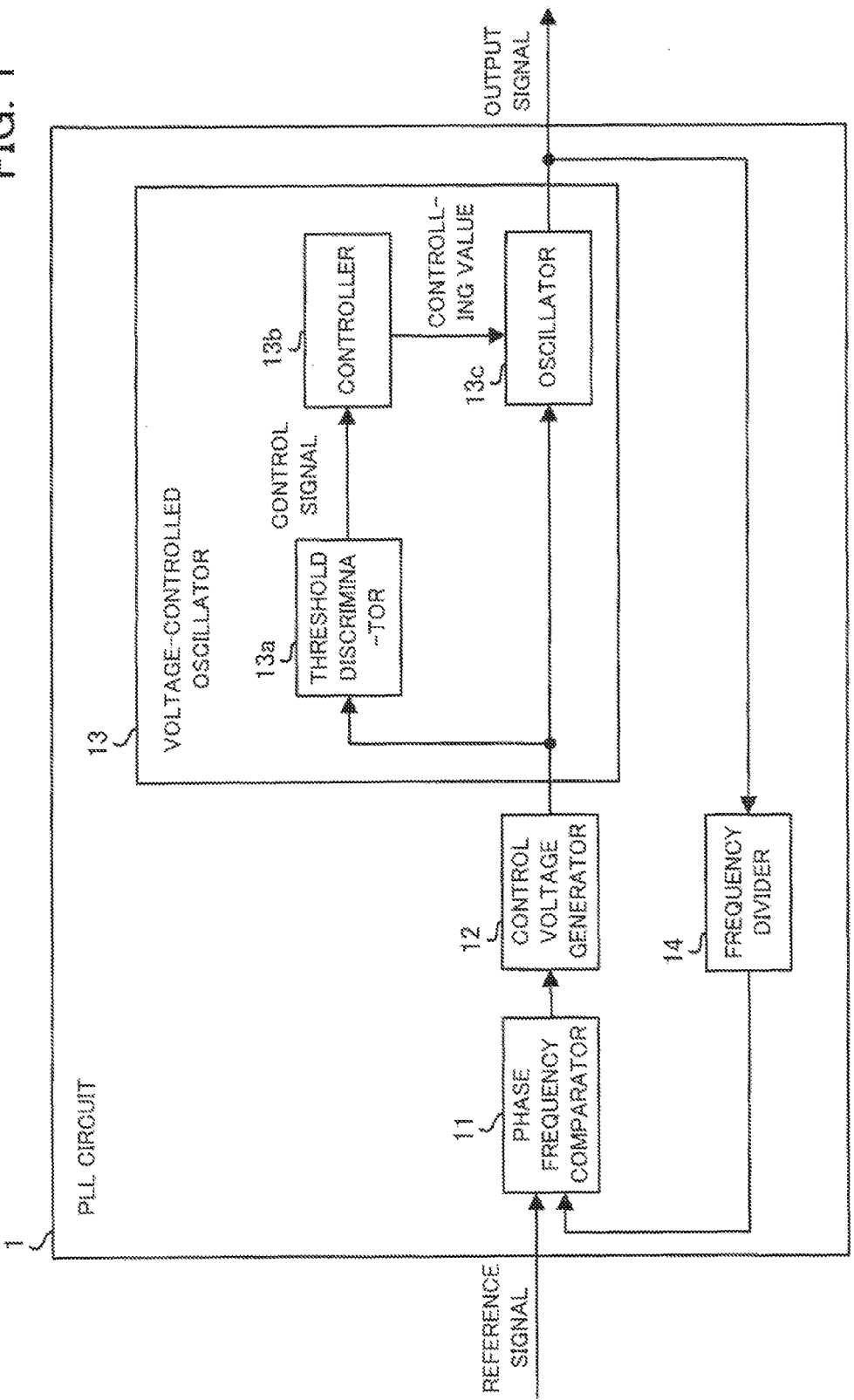
FIG. 1 illustrates a first embodiment.

Embodiments of the present invention will be described below with reference to the accompanying drawings, wherein like reference numerals refer to like elements throughout.

First Embodiment

FIG. 1 illustrates a first embodiment. A PLL circuit 1 according to this embodiment is input with a reference signal and outputs a signal of which the frequency is equal to that of a reference clock indicated by the reference signal and of which the phase is synchronized with that of the reference clock.

The PLL circuit 1 illustrated in FIG. 1 comprises a phase frequency comparator 11, a control voltage generator 12, a voltage-controlled oscillator 13, and a frequency divider 14. The voltage-controlled oscillator 13 includes a threshold discriminator 13a, a controller 13b, and an oscillator 13c.

The phase frequency comparator 11 compares the phase of the input reference signal with that of a frequency-divided signal to generate a phase difference signal. Specifically, the phase frequency comparator 11 outputs an up (UP) signal as the phase difference signal if the phase of the frequency-divided signal is delayed with respect to that of the reference signal, and outputs a down (DN) signal as the phase difference signal if the phase of the frequency-divided signal is advanced with respect to that of the reference signal.

The control voltage generator 12 generates a control voltage corresponding to the phase difference signal output from the phase frequency comparator 11, and outputs the generated control voltage.

In accordance with the control voltage output from the control voltage generator 12, the voltage-controlled oscillator 13 controls the oscillation frequency of the signal output from the PLL circuit 1.

The threshold discriminator 13a generates a control signal indicative of a relative level, high or low, of the control voltage output from the control voltage generator 12. Specifically, the threshold discriminator 13a compares the control voltage with a reference value of an operating voltage (e.g., a median value of the operating voltage) of the voltage-controlled oscillator 13. If the control voltage is higher than the reference value, the threshold discriminator 13a judges that the control voltage is high, and if the control voltage is lower than the reference value, the threshold discriminator 13a judges that the control voltage is low. Also, in accordance with the decision thus made, the threshold discriminator 13a outputs a control signal indicating that the control voltage is high or low in level.

The controller 13b outputs a controlling value for controlling the oscillator 13c in accordance with the control signal. Also, the controller 13b judges that a carry-over has occurred, when either one of the following conditions is fulfilled: (a) the control signal indicates a high level when the controlling value specifies a correspondence relation of which the upper and lower limits of the oscillation frequency are highest; and (b) the control signal indicates a low level when the controlling value specifies a correspondence relation of which the upper and lower limits of the oscillation frequency are lowest. When the occurrence of a carry-over is detected, the controller 13b outputs a predetermined controlling value for preventing deadlock of the PLL circuit 1.

The oscillator 13c has a plurality of control voltage-to-oscillation frequency correspondence relations set therein such that the correspondence relations have respective different upper and lower limits of the oscillation frequency. Each of the correspondence relations is indicated by a V-f curve, for example, as described later with reference to FIG. 5. Also, in the oscillator 13c, the correspondence relations are correlated with the respective controlling values. The oscillator 13c outputs a signal with an oscillation frequency corresponding to the control voltage and associated with the correspondence relation specified by the controlling value.

The frequency divider 14 divides the frequency of the output signal fed back from the voltage-controlled oscillator 13, in a predetermined division ratio to generate the frequency-divided signal.

In the PLL circuit thus configured, the phase of the input reference signal is compared with that of the frequency-divided signal by the phase frequency comparator 11, which then generates the phase difference signal. In accordance with the phase difference signal, the control voltage generator 12 generates the control voltage.

In the voltage-controlled oscillator 13, the oscillation frequency of the output signal is controlled in accordance with the control voltage. Specifically, the threshold discriminator 13a generates the control signal indicative of the relative level, high or low, of the control voltage. The controller 13b outputs the controlling value corresponding to the control signal. If either of the following two conditions is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, the controller 13b outputs the predetermined controlling value. In the oscillator 13c, the multiple control voltage-to-oscillation frequency correspondence relations are determined such that the correspondence relations have respective different upper and lower limits of the oscillation frequency and are correlated with the respective controlling values. The oscillator 13c outputs a signal with an oscillation frequency corresponding to the control voltage and associated with the correspondence relation specified by the controlling value.

The output signal is fed back to the frequency divider 14, which then divides the frequency of the output signal to generate the frequency-divided signal.

Consequently, when it is judged by the controller 13b that a carry-over has occurred, the controlling value is reset to the predetermined value for releasing the PLL circuit from deadlock, whereby deadlock can be prevented.

Second Embodiment

Figure 2:
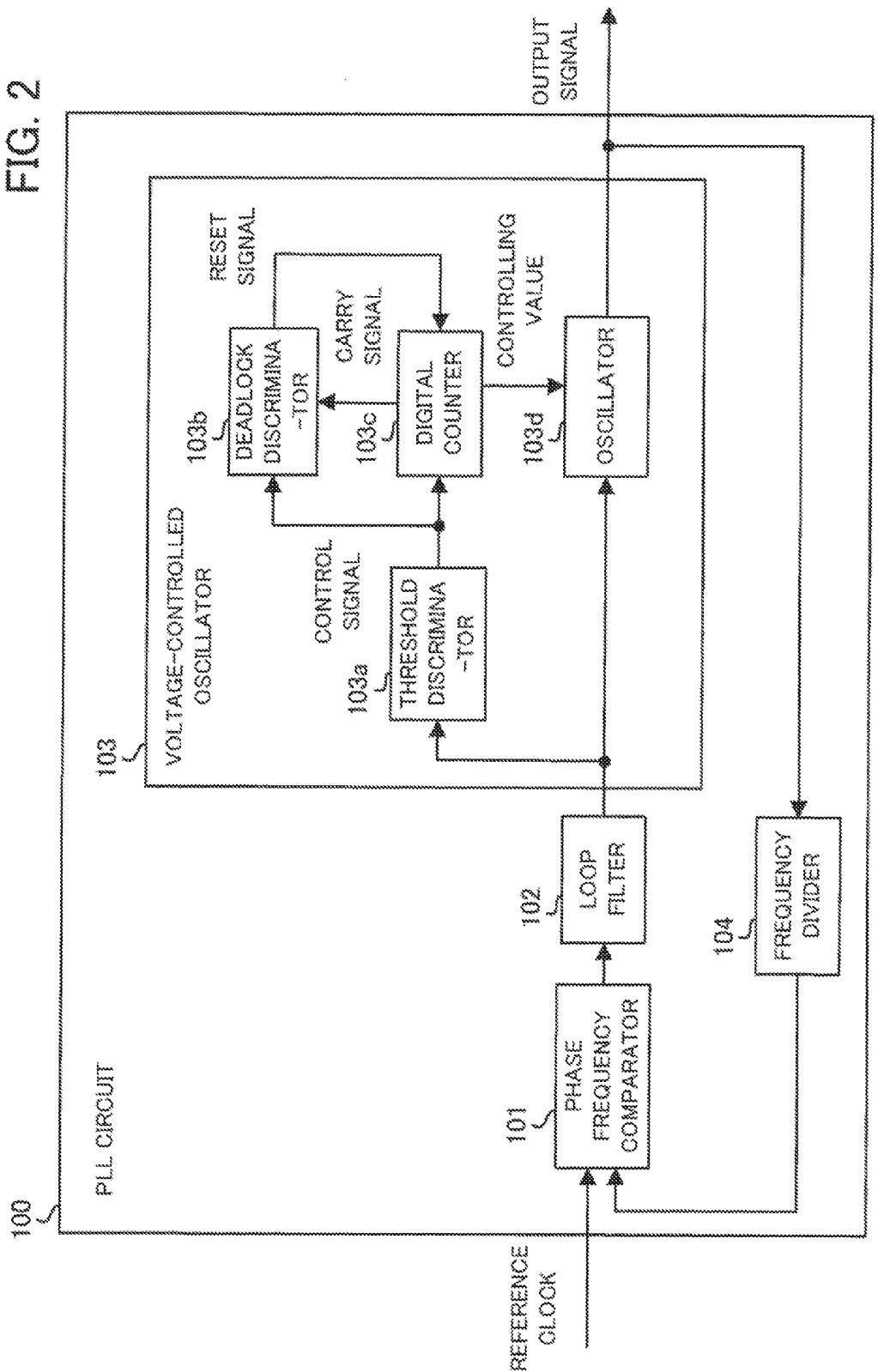
FIG. 2 illustrates the configuration of a PLL circuit according to a second embodiment.

FIG. 2 illustrates the configuration of a PLL circuit according to a second embodiment. As illustrated in FIG. 2, the PLL circuit 100 of this embodiment is input with a reference clock signal and outputs a signal of which the frequency is equal to that of the reference clock signal and of which the phase is synchronized with that of the reference clock signal.

The PLL circuit 100 comprises a phase frequency comparator 101, a loop filter 102, a voltage-controlled oscillator 103, and a frequency divider 104. The voltage-controlled oscillator 103 includes a threshold discriminator 103a, a deadlock discriminator 103b, a digital counter 103c, and an oscillator 103d.

The phase frequency comparator 101 compares the phase of the input reference signal with that of a frequency-divided signal to generate a phase difference signal. Specifically, the phase frequency comparator 101 outputs an up signal as the phase difference signal if the phase of the frequency-divided signal is delayed relative to that of the reference signal, and outputs a down signal as the phase difference signal if the phase of the frequency-divided signal is advanced relative to that of the reference signal.

The loop filter 102 generates a smoothed control voltage based on the phase difference signal output from the phase frequency comparator 101, and outputs the generated control voltage.

In accordance with the control voltage output from the loop filter 102, the voltage-controlled oscillator 103 controls the oscillation frequency of the signal output from the PLL circuit 100.

The threshold discriminator 103a generates a control signal indicative of a relative level of the control voltage output from the loop filter 102. Specifically, the threshold discriminator 103a compares the control voltage with a reference value of an operating voltage (e.g., a median value of the operating voltage) of the voltage-controlled oscillator 103. If the control voltage is higher than the reference value, the threshold discriminator 103a judges that the control voltage is high, and if the control voltage is lower than the reference value, the threshold discriminator 103a judges that the control voltage is low. Also, in accordance with the result of the decision thus made, the threshold discriminator 103a outputs a control signal indicating that the control voltage is high or low in level.

The digital counter 103c outputs a controlling value n for controlling the oscillator 103d in accordance with the control signal. If the control signal output from the threshold discriminator 103a indicates a high level when the controlling value n specifies a V-f curve of which the upper and lower limits of the oscillation frequency are highest, that is, when the controlling value n is equal to its upper limit, the digital counter 103c outputs a carry signal indicating that the controlling value n is at its upper limit. Also, if the control signal output from the threshold discriminator 103a indicates a low level when the controlling value n specifies a V-f curve of which the upper and lower limits of the oscillation frequency are lowest, that is, when the controlling value n is equal to its lower limit, the digital counter 103c outputs a carry signal indicating that the controlling value n is at its lower limit.

Further, in response to a reset signal output from the deadlock discriminator 103b, the digital counter 103c outputs a predetermined controlling value n for preventing deadlock of the PLL circuit 100.

Specifically, if the control signal indicates a high level when the controlling value n is equal to its maximum value $n_{MAX}$, the digital counter 103c outputs a minimum value $n_{MIN}$ of the controlling value n. If the control signal indicates a low level when the controlling value n is equal to its minimum value $n_{MIN}$, the digital counter 103c outputs the maximum value $n_{MAX}$ of the controlling value n.

Alternatively, when the control signal indicates a high level even though the controlling value n is equal to the maximum value $n_{MAX}$, the digital counter 103c may output a controlling value specifying the V-f curve of which the upper limit of the oscillation frequency is lower than and at the same time closest to the frequency of the reference clock signal. Also, when the control signal indicates a low level even though the controlling value n is equal to the minimum value $n_{MIN}$, the digital counter 103c may output a controlling value specifying the V-f curve of which the lower limit of the oscillation frequency is higher than and at the same time closest to the frequency of the reference clock signal.

Thus, the number of times the controlling value n is moved before completion of the locking can be reduced, making it possible to shorten the time necessary to complete the locking.

Also, the controlling value n to be reset after the occurrence of a carry-over can be set to a desired value.

When the carry signal is output from the digital counter 103c, the deadlock discriminator 103b judges that a carry-over has occurred, and therefore, outputs a reset signal. At this time, the deadlock discriminator 103b may output a different reset signal depending on whether the received carry signal indicates that the controlling value n is at the upper limit or at the lower limit. Thus, the controlling value n can be reset to a different suitable value depending on whether deadlock is likely to be caused because the controlling value n is at the upper limit or the controlling value n is at the lower limit.

The oscillator 103d has set therein a plurality of V-f curves each indicating a control voltage-to-oscillation frequency correspondence relation, such that the V-f curves have respective different upper and lower limits of the oscillation frequency. The V-f curves will be described later with reference to FIG. 5.

In the oscillator 103d, the multiple V-f curves and the controlling values n are correlated with each other in such a manner that the minimum value $n_{MIN}$ is associated with the V-f curve with the lowest upper and lower limits of the oscillation frequency while the maximum value $n_{MAX}$ is associated with the V-f curve with the highest upper and lower limits of the oscillation frequency. The oscillator 103d outputs a signal with an oscillation frequency corresponding to the control voltage and associated with the V-f curve specified by the controlling value n.

The frequency divider 104 generates the frequency-divided signal by dividing, in a predetermined division ratio, the frequency of the output signal fed back from the voltage-controlled oscillator 103.

Deadlock of the PLL circuit will be now explained.

Figure 3A:
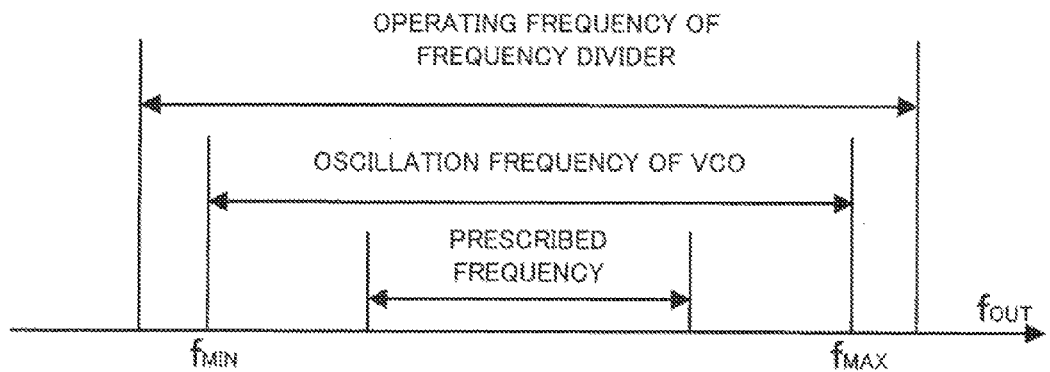
FIGS. 3A and 3B illustrate the relationship of frequencies with deadlock of a PLL circuit.
Figure 3B:
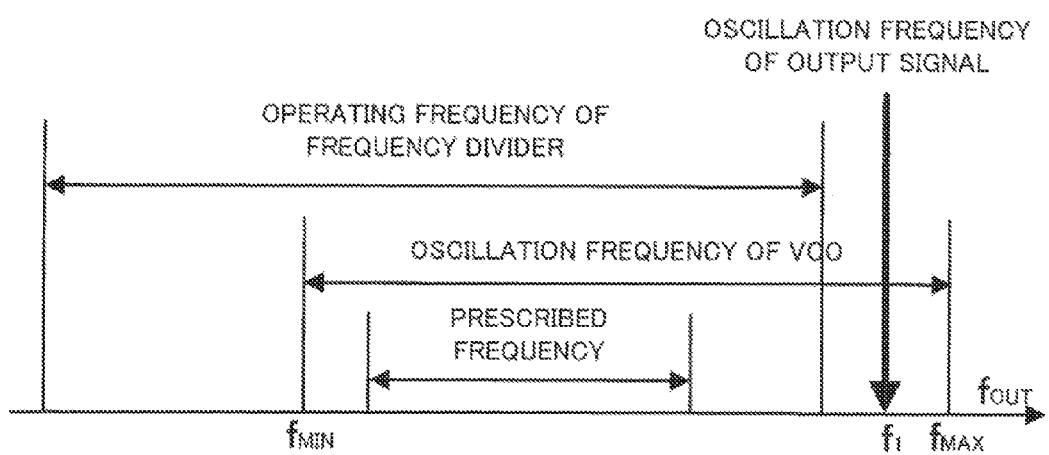

FIGS. 3A and 3B illustrate the relationship of frequencies with deadlock of the PLL circuit, wherein FIG. 3A illustrates ideal frequency ranges of the PLL circuit and FIG. 3B exemplifies frequency ranges where a deadlock occurs.

Usually, the relationship of a prescribed frequency at which the PLL circuit is expected to operate normally, with the oscillation frequency, which is the frequency of the output signal from the voltage-controlled oscillator (VCO), and the operating frequency of the input signal to the frequency divider, at which the frequency divider operates normally, is such that the prescribed frequency range is the narrowest, as illustrated in FIG. 3A. Also, the oscillation frequency range of the voltage-controlled oscillator contains the prescribed frequency range. Further, the operating frequency range of the frequency divider contains the oscillation frequency range of the voltage-controlled oscillator.

Deadlock of the PLL circuit occurs because, among other causes, the oscillation frequency of the signal output from the voltage-controlled oscillator deviates from the operating frequency range of the frequency divider. The variable frequency range of a high-frequency LC voltage-controlled oscillator is, however, determined by its own variation characteristic different from that of the frequency divider. Thus, in order to design the PLL circuit such that the oscillation frequency range $f_{VCO}$ of the output signal of the voltage-controlled oscillator and the operating frequency range $f_{FD}$ of the frequency divider always fulfill the relationship of $f_{VCO} \subset f_{FD}$, as illustrated in FIG. 3A, the frequency divider needs to have a wide-range frequency characteristic so as to allow for the frequency variation of the voltage-controlled oscillator, making the design difficult.

On the other hand, the oscillation frequency range of the output signal of the voltage-controlled oscillator can deviate from the operating frequency range of the frequency divider due to design error, trouble such as failure, or an accident such as the occurrence of noise, as illustrated in FIG. 3B. If, in such a situation, a signal with a frequency $f_1$, for example, which is outside the operating frequency range of the frequency divider, is output from the voltage-controlled oscillator, the frequency divider possibly fails to output a normal frequency-divided signal, as explained below with reference to FIGS. 4A, 4B and 4C. As a result, the frequency divider may possibly become unable to operate normally even after the frequency of the reference clock signal is restored to the prescribed frequency, causing a deadlock and making the PLL circuit incapable of normal locking.

Figure 4A:
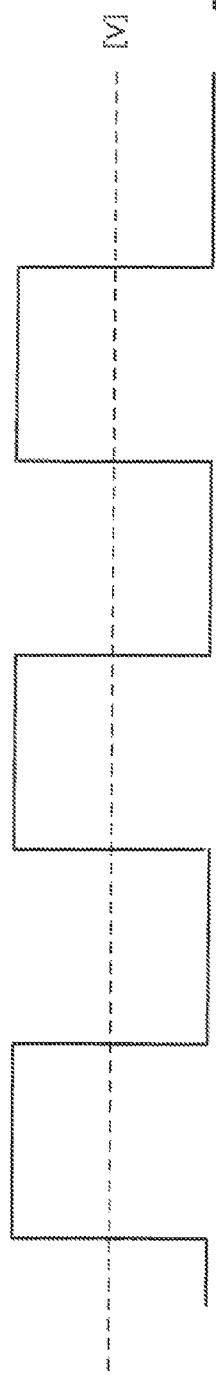
FIGS. 4A, 4B and 4C illustrate the relationship between the signal input to a frequency divider and the operation of the frequency divider.
Figure 4B:
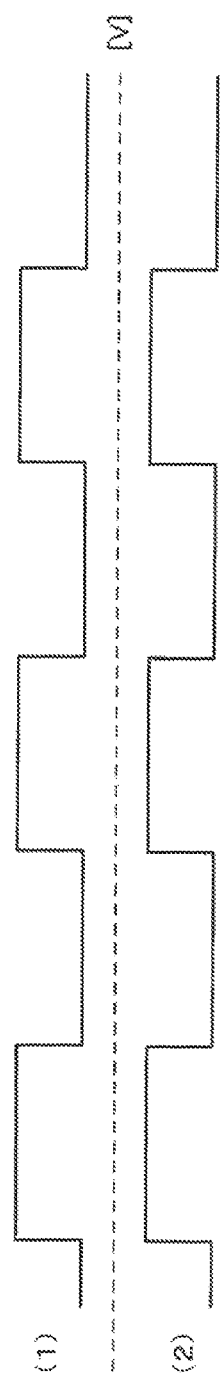
Figure 4C:
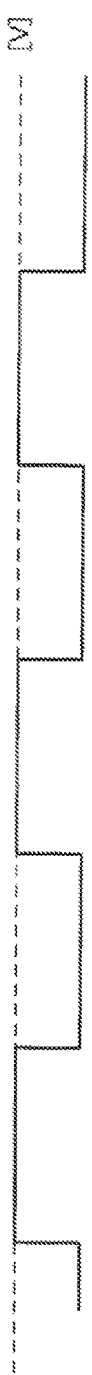

FIGS. 4A, 4B and 4C illustrate the relationship between the signal input to the frequency divider and the operation of the frequency divider.

Usually, the signal output from the voltage-controlled oscillator and input to the frequency divider has a horizontally symmetric waveform with a sufficient amplitude, as illustrated in FIG. 4A. If the oscillation frequency of the output signal increases, however, the gain can possibly decrease, and as a result, the amplitude becomes small.

In such case, the signal level may undergo additional fluctuation under the influence of temperature, voltage or the like, as illustrated in FIGS. 4B and 4C. When the signal fluctuates in the manners as indicated by (1) and (2) in FIG. 4B, the output signal level of the frequency divider is thought to be fixed at high and low levels, respectively. On the other hand, when the signal fluctuates in the manner as illustrated in FIG. 4C, the operation of the frequency divider is thought to become unstable. Where the signal fluctuates as illustrated in FIG. 4C, it is difficult to release the PLL circuit from a deadlock by the aforementioned conventional method that utilizes the fixed high or low level of the output signal of the frequency divider to release the PLL circuit from the deadlock.

In contrast, according to this embodiment, the deadlock prevention action is executed within the voltage-controlled oscillator 103 (explained above with reference to FIG. 2), and therefore, the occurrence of deadlock can be prevented even in cases where the output signal level of the frequency divider is not fixed.

The operation according to this embodiment will be now described.

Figure 5:
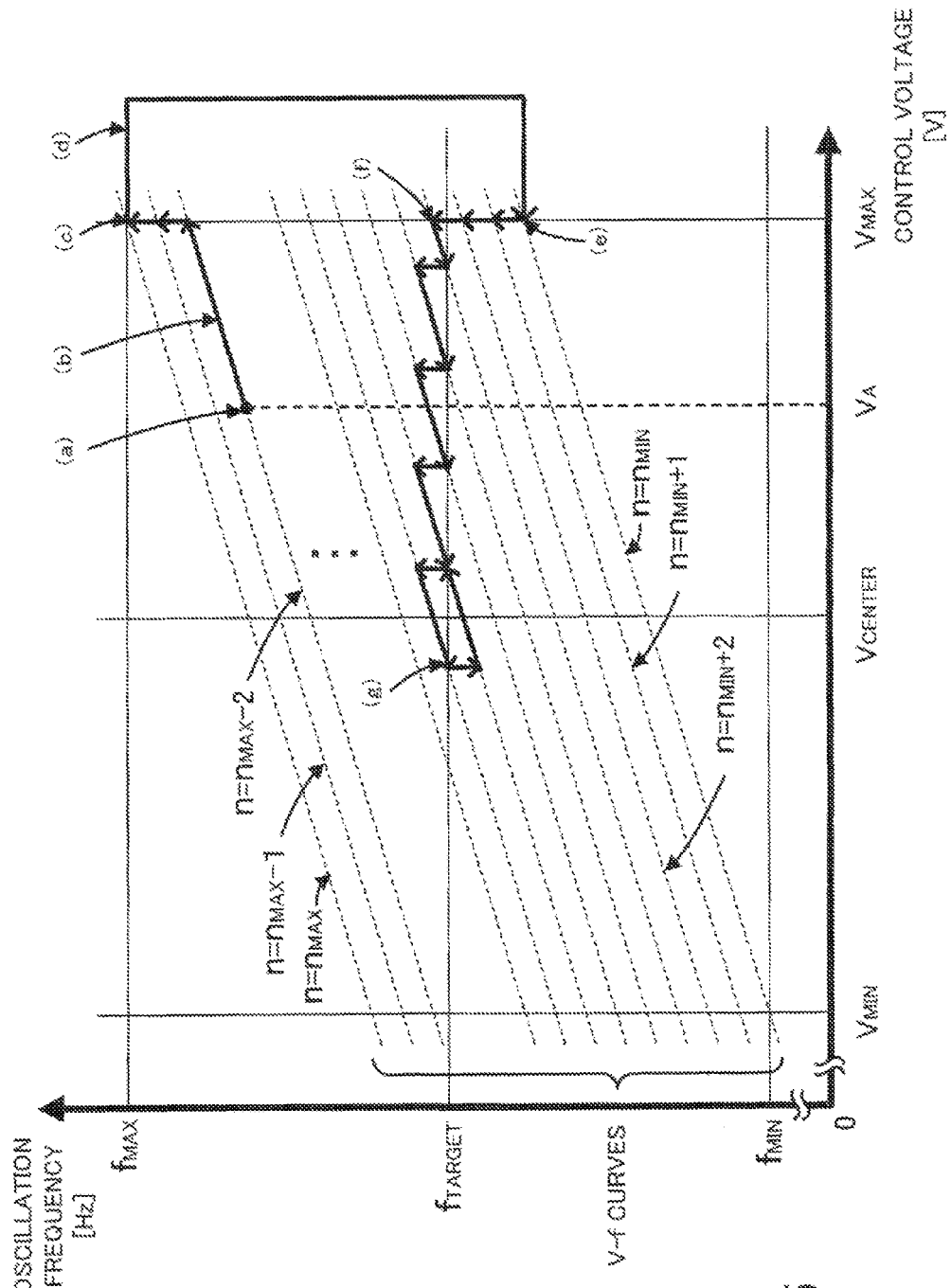
FIG. 5 illustrates the operation of a voltage-controlled oscillator according to the second embodiment.

FIG. 5 illustrates the operation of the voltage-controlled oscillator according to the second embodiment. More specifically, FIG. 5 illustrates the V-f curves each indicating the relationship between the control voltage input to the voltage-controlled oscillator 103 (already explained with reference to FIG. 2) of the PLL circuit 100 (also explained above with reference to FIG. 2) of the second embodiment and the oscillation frequency of the signal output from the voltage-controlled oscillator.

In FIG. 5, the horizontal axis indicates the control voltage (V) input to the voltage-controlled oscillator 103, and the vertical axis indicates the oscillation frequency (Hz) of the signal output from the voltage-controlled oscillator 103 when the corresponding control voltage is input.

A plurality of V-f curves each indicating the control voltage-to-oscillation frequency correspondence relation are determined in such a manner that the V-f curves have respective different upper and lower limits of the oscillation frequency. The number of the V-f curves is equal to the number of the controlling values n, and the V-f curves are correlated with the controlling values n from the minimum value $n_{MIN}$ to the maximum value $n_{MAX}$ in ascending order of the upper and lower limits of the oscillation frequency.

As illustrated in FIG. 5, when the control voltage is higher than $V_{CENTER}$ (when the point corresponding to the control voltage is located on the right of $V_{CENTER}$ in FIG. 5), the voltage-controlled oscillator 103 increases the controlling value n by changing the V-f curve to the one immediately above. On the other hand, when the control voltage is lower than $V_{CENTER}$ (when the point corresponding to the control voltage is located on the left of $V_{CENTER}$ in FIG. 5), the controlling value n is decreased by changing the V-f curve to the one immediately below. This process will be explained in detail later with reference to FIGS. 6 and 7.

Let us suppose that while the controlling value n is set to $n_{MAX}-2$, the control voltage $V_A$ higher than $V_{CENTER}$ is input to the voltage-controlled oscillator 103, as indicated at (a) in FIG. 5, and thereafter increases up to $V_{MAX}$, as indicated at (b). In this case, the controlling value n of the voltage-controlled oscillator 103 is incremented until the maximum value $n_{MAX}$ is reached, with the result that the oscillation frequency of the voltage-controlled oscillator 103 also increases.

When $f_{MAX}$, which is the maximum value of the oscillation frequency, is reached as indicated at (c), the frequency divider 104 (already explained above with reference to FIG. 2) may become unable to operate normally and a deadlock may possibly occur if the oscillation frequency range of the voltage-controlled oscillator 103 is not included in the operating frequency range of the frequency divider 104 and also if the oscillation frequency of the signal output from the voltage-controlled oscillator 103 is outside the operating frequency range of the frequency divider 104, like the oscillation frequency $f_1$, as stated above with reference to FIG. 3B.

In the voltage-controlled oscillator 103 of this embodiment, by contrast, when the maximum value $f_{MAX}$ of the oscillation frequency is reached, as indicated at (c), and if a carry-over demanding increment of the controlling value n occurs, the controlling value n is reset, as indicated at (d), to a predetermined value (e.g., a minimum value indicated at (e)).

After the controlling value n is reset as indicated at (d), the voltage-controlled oscillator 103 of this embodiment resumes its operation from the thus-reset controlling value n $(=n_{MIN})$ indicated at (e). As a consequence, the oscillation frequency of the voltage-controlled oscillator 103 lowers. Since, at this time, the oscillation frequency again enters the normally operable range, the operation of the PLL circuit 100 can be restored to normalcy. Thus, in the PLL circuit 100 of this embodiment, the occurrence of deadlock is prevented.

Then, after the normal operation of the PLL circuit 100 is restored, the oscillation frequency converges and is locked in the vicinity of $f_{TARGET}$. The following describes in detail the manner of how the voltage-controlled oscillator operates until the oscillation frequency is locked.

Since the control voltage at this time is $V_{MAX}$ higher than $V_{CENTER}$, the controlling value n is incremented and the selected V-f curve changes in accordance with the controlling value n. Consequently, the oscillation frequency of the voltage-controlled oscillator 103 increases correspondingly.

If the oscillation frequency becomes higher than the target reference clock frequency $f_{TARGET}$ as indicated at (f), the control voltage lowers, so that the oscillation frequency decreases along the V-f curve. Also, when the control voltage is higher than $V_{CENTER}$, the controlling value n is incremented and the selected V-f curve changes in accordance with the controlling value n.

Subsequently, if the control voltage becomes equal to or lower than $V_{CENTER}$ as indicated at (g), the controlling value n is decremented and the selected V-f curve changes in accordance with the controlling value n. Also, when the oscillation frequency is lower than $f_{TARGET}$, the control voltage increases, so that the oscillation frequency increases along the V-f curve. The voltage-controlled oscillator 103 thereafter repeats this operation, that is, the locked state is maintained as long as the reference clock frequency is within the normally operable range.

The foregoing applies also to the case where the controlling value is decremented when the oscillation frequency of the voltage-controlled oscillator 103 is equal to the minimum value $f_{MIN}$.

If an oscillation frequency outside the operating frequency range of the frequency divider 104 is output thereafter from the voltage-controlled oscillator 103, the voltage-controlled oscillator 103 is unlocked and the aforementioned operation is executed to reset the controlling value n.

The process executed in this embodiment will be now described.

Figure 6:
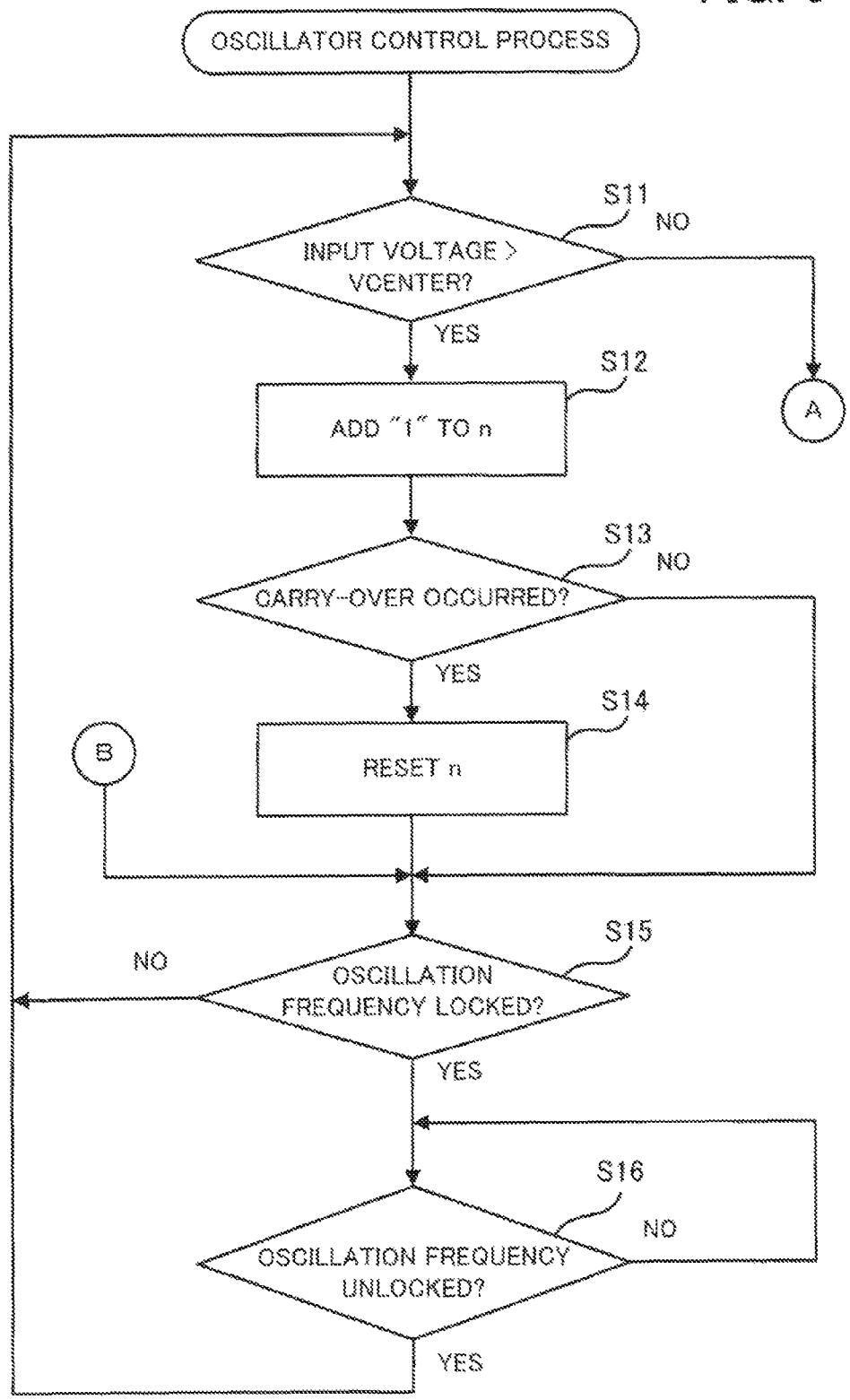
FIG. 6 is a flowchart illustrating the procedure of a process for controlling the voltage-controlled oscillator of the second embodiment.
Figure 7:
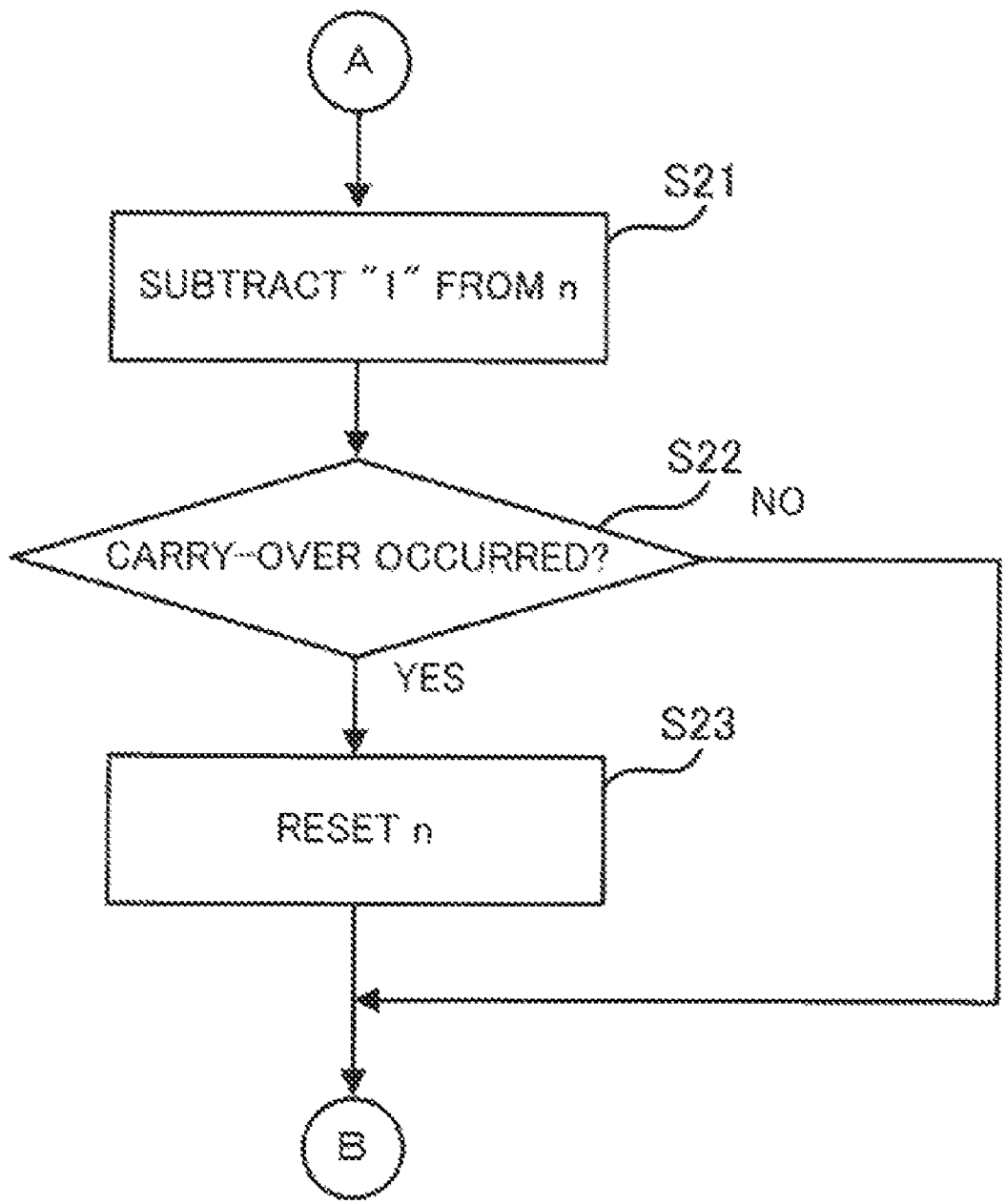
FIG. 7 is a flowchart also illustrating the procedure of the process for controlling the voltage-controlled oscillator of the second embodiment.

FIGS. 6 and 7 are flowcharts illustrating the procedure of the process for controlling the voltage-controlled oscillator according to the second embodiment. The process of controlling the voltage-controlled oscillator, illustrated in FIGS. 6 and 7, is a process for outputting the controlling value n which allows the oscillator 103*d* (already explained above with reference to FIG. 2) to select the V-f curve in accordance with the occurrence or nonoccurrence of carry-over as well as the input voltage to the voltage-controlled oscillator 103 (already explained above with reference to FIG. 2), and for determining whether the oscillation frequency has been locked or not and whether the oscillation frequency has been unlocked or not. The process of controlling the voltage-controlled oscillator is executed during the operation of the PLL circuit 100 (already explained above with reference to FIG. 2).

Step S11: The threshold discriminator 103*a* (already explained above with reference to FIG. 2) determines whether or not the input voltage to the voltage-controlled oscillator 103 is higher than $V_{CENTER}$. If the input voltage is higher than $V_{CENTER}$, the process proceeds to Step S12. On the other hand, if the input voltage is equal to or lower than $V_{CENTER}$, the process proceeds to Step S21 (FIG. 7).

Step S12: The digital counter 103*c* (already explained above with reference to FIG. 2) adds "1" to the controlling value n held thereby. If the controlling value n is already at the maximum value and thus the addition of "1" results in a carry-over, the digital counter 103*c* outputs a carry signal indicating the occurrence of a carry-over.

Step S13: The deadlock discriminator 103*b* detects the carry signal to determine whether or not a carry-over has occurred in Step S12. If a carry-over has occurred, the deadlock discriminator 103*b* outputs a reset signal and then the process proceeds to Step S14. If, on the other hand, no carry-over has occurred, the process proceeds to Step S15.

Step S14: The digital counter 103*c* resets the controlling valve n held thereby. At this time, the digital counter 103*c* sets the controlling value n to the minimum value. Alternatively, the digital counter 103*c* may reset the controlling value n to a desired value, such as the median value or a value close to $f_{TARGET}$.

Step S15: The oscillator 103*d* determines whether or not the oscillation frequency has been locked. If the oscillation frequency is locked, the process proceeds to Step S16. On the other hand, if the oscillation frequency is not locked and is converging, the process proceeds to Step S11.

Step S16: The oscillator 103*d* determines whether or not the oscillation frequency has been unlocked. If the oscillation frequency is unlocked, the process proceeds to Step S11; if not, Step S16 is repeatedly executed.

Step S21: The digital counter 103*c* subtracts "1" from the controlling value n held thereby. If, at this time, the controlling value n is already at the minimum value and thus the subtraction results in a carry-over, the digital counter 103*c* outputs a carry signal indicating the occurrence of a carry-over.

Step S22: The deadlock discriminator 103*b* detects the carry signal to determine whether or not a carry-over has occurred in Step S21. If a carry-over has occurred, the deadlock discriminator 103*b* outputs a reset signal and then the process proceeds to Step S23. On the other hand, if no carry-over has occurred, the process proceeds to Step S15 (FIG. 6).

Step S23: The digital counter 103*c* resets the controlling valve n held thereby. At this time, the digital counter 103*c* sets the controlling value n to the maximum value. Alternatively, the digital counter 103*c* may reset the controlling value n to a desired value, such as the median value or a value close to $f_{TARGET}$.

As described above, according to the second embodiment, the occurrence of deadlock can be prevented even in cases where the frequency-divided signal is not fixed at a high or a low level.

Third Embodiment

A third embodiment will be now described. The following description is focused on the difference between the second and third embodiments. Also, like reference numerals are used to denote like elements, and description of such elements is omitted.

The third embodiment differs from the second embodiment in that the digital counter includes an adder and is configured to output a controlling value based on the control signal.

Figure 8:
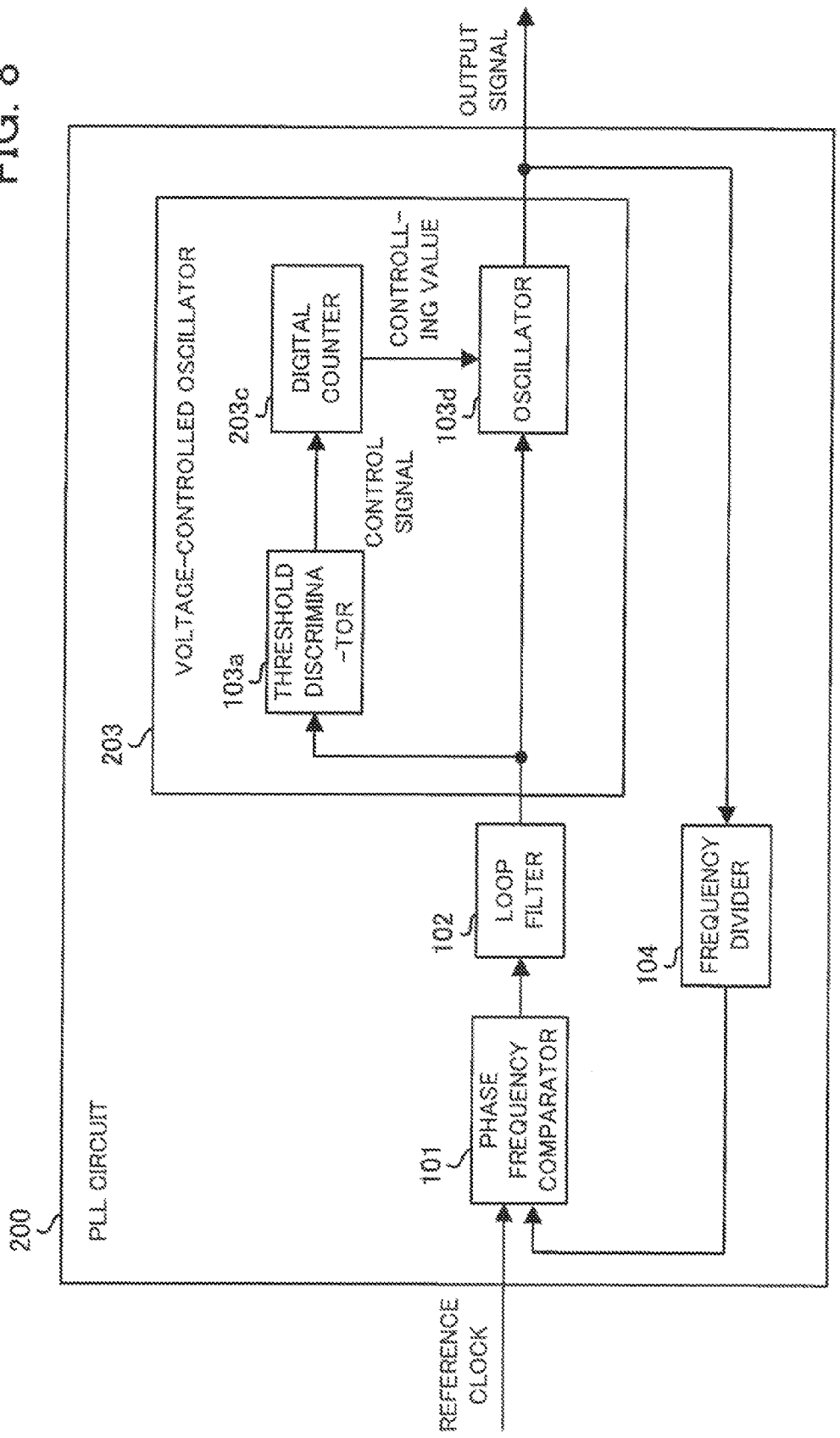
FIG. 8 illustrates the configuration of a PLL circuit according to a third embodiment.

FIG. 8 illustrates the configuration of a PLL circuit according to the third embodiment. As illustrated in FIG. 8, the PLL circuit 200 of this embodiment is input with a reference clock signal and outputs a signal of which the frequency is equal to that of the reference clock signal and of which the phase is synchronized with that of the reference clock signal, like the PLL circuit of the second embodiment.

The PLL circuit 200 comprises a phase frequency comparator 101, a loop filter 102, a voltage-controlled oscillator 203, and a frequency divider 104. The voltage-controlled oscillator 203 includes a threshold discriminator 103*a*, a digital counter 203*c*, and an oscillator 103*d*.

The phase frequency comparator 101 compares the phase of the input reference signal with that of a frequency-divided signal to generate a phase difference signal, like the counterpart of the second embodiment.

The loop filter 102 generates a smoothed control voltage based on the phase difference signal output from the phase frequency comparator 101, and outputs the generated control voltage, like the counterpart of the second embodiment.

In accordance with the control voltage output from the loop filter 102, the voltage-controlled oscillator 203 controls the oscillation frequency of the output signal from the PLL circuit 200, like the voltage-controlled oscillator 103 of the second embodiment.

The threshold discriminator 103*a* generates a control signal indicating a relative level of the control voltage output from the loop filter 102, like the counterpart of the second embodiment. In accordance with the result of the decision made, the threshold discriminator 103*a* outputs a control signal indicating that the control voltage is high or low in level.

The digital counter 203*c* outputs a controlling value n for controlling the oscillator 103*d* in accordance with the control signal. The digital counter 203*c* will be described later with reference to FIGS. 9A and 9B. If the control signal output from the threshold discriminator 103*a* indicates a high level when the controlling value n specifies the V-f curve of which the upper and lower limits of the oscillation frequency are highest, that is, when the controlling value n is equal to its upper limit, the digital counter 203*c* outputs a predetermined controlling value n for preventing deadlock of the PLL circuit 200 when the controlling value n is already at the upper limit. Further, if the control signal output from the threshold discriminator 103*a* indicates a low level when the controlling value n specifies the V-f curve of which the upper and lower limits of the oscillation frequency are lowest, that is, when the controlling value n is equal to its lower limit, the digital counter 203*c* outputs a predetermined controlling value n for preventing deadlock of the PLL circuit 200 when the controlling value n is already at the lower limit.

Specifically, if the control signal indicates a high level when the controlling value n is equal to the maximum value $n_{MAX}$, the digital counter 203c outputs the minimum value $n_{MIN}$ of the controlling value n. If the control signal indicates a low level when the controlling value n is equal to the minimum value $n_{MIN}$, the digital counter 203c outputs the maximum value $n_{MAX}$ of the controlling value n.

Thus, the controlling value n can be reset to a different suitable value depending on whether deadlock is likely to be caused because the controlling value n is at the upper limit or the controlling value n is at the lower limit, as in the second embodiment.

Alternatively, when the control signal indicates a high level even though the controlling value n is already at the maximum value $n_{MAX}$, the digital counter 203c may output a controlling value specifying the V-f curve of which the upper limit of the oscillation frequency is lower than and at the same time closest to the frequency of the reference clock signal. Also, when the control signal indicates a low level even though the controlling value n is already at the minimum value $n_{MIN}$, the digital counter 203c may output a controlling value specifying the V-f curve of which the lower limit of the oscillation frequency is higher than and at the same time closest to the frequency of the reference clock signal.

The oscillator 103d has set therein a plurality of V-f curves each indicating a control voltage-to-oscillation frequency correspondence relation, such that the V-f curves have respective different upper and lower limits of the oscillation frequency, like the counterpart of the second embodiment. The oscillator 103d outputs a signal with an oscillation frequency corresponding to the control voltage and associated with the V-f curve specified by the controlling value n. The number of the V-f curves is equal to the number of the controlling values n.

In the oscillator 103d, the multiple V-f curves and the controlling values n are correlated with each other in such a manner that the minimum value $n_{MIN}$ is associated with the V-f curve with the lowest upper and lower limits of the oscillation frequency while the maximum value $n_{MAX}$ is associated with the V-f curve with the highest upper and lower limits of the oscillation frequency. The oscillator 103d outputs a signal with the oscillation frequency corresponding to the control voltage and associated with the V-f curve specified by the controlling value n.

The frequency divider 104 generates the frequency-divided signal by dividing, in a predetermined division ratio, the output signal fed back from the voltage-controlled oscillator 203, like the counterpart of the second embodiment.

Figure 9A:
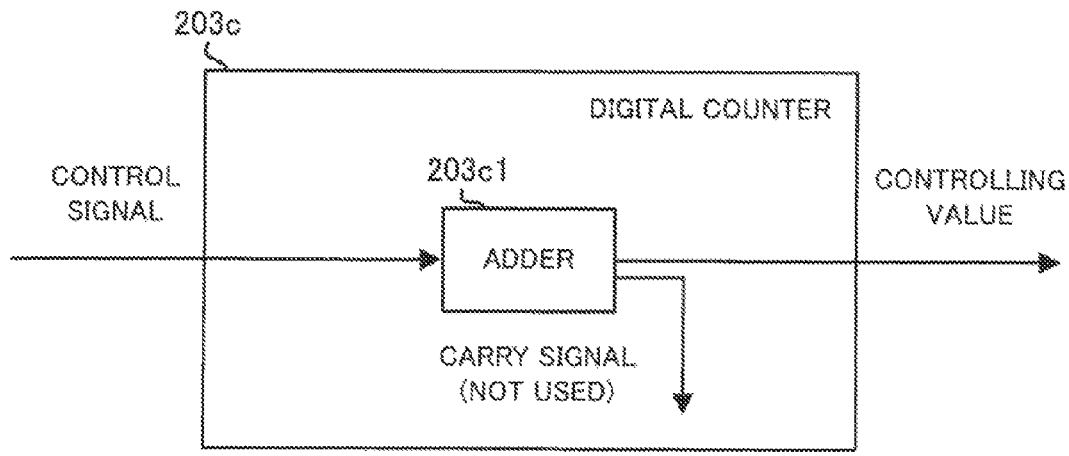
FIGS. 9A and 9B illustrate the configuration of a digital counter according to the third embodiment.
Figure 9B:
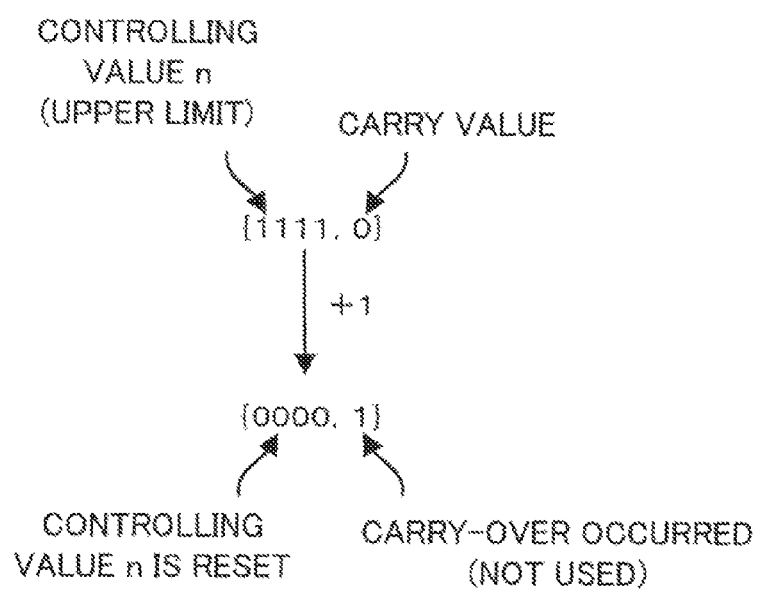

FIGS. 9A and 9B illustrate the configuration of the digital counter used in the third embodiment. As illustrated in FIG. 9A, the digital counter 203c includes an adder 203c1. The adder 203c1 has an m-bit (e.g., 4-bit) counter, and when a carry-over occurs, the controlling value n is reset, as illustrate in FIG. 9B.

When the control signal input to the digital counter 203c as illustrated in FIG. 9A indicates a high level, the adder 203c1 adds "1" to the controlling value n, and when the control signal indicates a low level, the adder 203c1 subtracts "1" from the controlling value n.

Also, if the upper limit of the controlling value n is exceeded as a result of the addition, that is, if a carry-over occurs, the adder 203c1 stores, as the controlling value, the value obtained by subtracting the difference between the upper and lower limits of the controlling value n from the sum of the controlling value n assumed before the addition and the incremental value. Specifically, assuming that $n_{MAX}=31$ and $n_{MIN}=0$, when "1" is added to the controlling value n which is already equal to $n_{MAX}$, $n_{MIN}$ is set as the controlling value n.

Further, if the controlling value n decreases below its lower limit as a result of the subtraction, that is, if a carry-over occurs, the adder 203c1 stores, as the controlling value, the value obtained by adding the difference between the upper and lower limits of the controlling value n to the difference between the controlling value n assumed before the subtraction and the decremental value, and outputs the stored controlling value. Specifically, where $n_{MAX}=31$ and $n_{MIN}=0$ and if "1" is subtracted from the controlling value n which already equals $n_{MIN}$, $n_{MAX}$ is set as the controlling value n.

Thus, in the digital counter 203c, the controlling value is reset so as to prevent deadlock when a carry-over has occurred, and therefore, the carry signal, which is output from the adder 203c1 when a carry-over occurs, is not used.

As illustrated in FIG. 9B, the adder 203c1 has a section for storing the controlling value n and a section for storing a carry value indicative of carry.

Let us suppose that the controlling value n stored in the adder 203c1 is equal to the maximum value (e.g., the four-digit binary number "1111"), as illustrated in FIG. 9B. In this case, when "1" is added to the controlling value n stored in the adder 203c1, the controlling value n of the adder 203c1 is reset to the minimum value (e.g., the four-digit binary number "0000"). Also, where the stored controlling value n is equal to the minimum value and if "1" is subtracted from the controlling value n, the controlling value is reset to the maximum value.

When a carry-over has occurred, the carry value stored in the adder 203c1 is not used in this embodiment, as stated above.

In this embodiment, provided the number of the V-f curves (i.e., the number of the controlling values n) is N, $N=2^m$ (where m is the number of digits of the controlling value n stored in the counter in the digital counter 203c). By configuring the digital counter 203c such that the N (i.e., $2^m$) controlling values are indicated with the use of the counter with m digits just enough to represent the controlling value n, it is possible to reset the controlling value n, which determines the V-f curve, by adding or subtracting the incremental or decremental value to or from the controlling value to cause carry or negation, with the carry signal ignored.

As described above, according to the third embodiment, when a carry-over of the controlling value n occurs in the adder 203c1, the necessary operation can be accomplished with ease by making use of an overflow caused by the addition and an underflow caused by the subtraction, as distinct from the second embodiment.

With the disclosed PLL circuit and voltage-controlled oscillator, deadlock can be reliably prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be substitutions and alterations could be made hereto without departing from the spirit and scope of the invention.

What is claimed is:

1. A PLL circuit comprising:
a control voltage generator configured to generate a control voltage in accordance with a phase difference between a phase of an output signal fed back thereto and a phase of an input reference signal; and a voltage-controlled oscillator configured to control an oscillation frequency of the output signal in accordance with the control voltage, wherein the voltage-controlled oscillator includes:

an oscillator configured to have plural sets of upper and lower limits of the oscillation frequency and a plurality of control voltage-to-oscillation frequency correspondence relations correlated with a plurality of controlling values, respectively, the oscillator being configured to output the output signal with the oscillation frequency corresponding to the control voltage and associated with the correspondence relation specified by the controlling value, a threshold discriminator configured to generate a control signal indicating a relative level of the control voltage, and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, wherein the controller includes an adder storing the controlling value, the adder being configured to add an incremental value to the stored controlling value if the control signal indicates a high level, subtract a decremental value from the stored controlling value if the control signal indicates a low level, store, as the controlling value, a value obtained by subtracting a difference between upper and lower limits of the controlling value from a sum of the controlling value assumed before the addition and the incremental value if the controlling value exceeds the upper limit as a result of the addition, store, as the controlling value, a value obtained by adding the difference between the upper and lower limits of the controlling value to a difference between the controlling value assumed before the subtraction and the decremental value if the controlling value decreases below the lower limit as a result of the subtraction, and output the stored controlling value.

2. The PLL circuit according to claim 1, wherein the adder stores the controlling value, adds "1" to the stored controlling value if the control signal indicates a high level, subtracts "1" from the stored controlling value if the control signal indicates a low level, stores the lower limit of the controlling value as the controlling value if the controlling value exceeds the upper limit as a result of the addition, stores the upper limit of the controlling value as the controlling value if the controlling value decreases below the lower limit as a result of the subtraction, and outputs the stored controlling value.

3. A PLL circuit comprising:

a control voltage generator configured to generate a control voltage in accordance with a phase difference between a phase of an output signal fed back thereto and a phase of an input reference signal; and a voltage-controlled oscillator configured to control an oscillation frequency of the output signal in accordance with the control voltage, wherein the voltage-controlled oscillator includes:

an oscillator configured to have plural sets of upper and lower limits of the oscillation frequency and a plurality of control voltage-to-oscillation frequency correspondence relations correlated with a plurality of controlling values, respectively, the oscillator being configured to output the output signal with the oscillation frequency corresponding to the control voltage and associated with the correspondence relation specified by the controlling value, a threshold discriminator configured to generate a control signal indicating a relative level of the control voltage, and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, wherein, if the control signal indicates a high level when the controlling value specifies the correspondence relation of which the upper and lower limits of the oscillation frequency are highest, the controller outputs the controlling value specifying the correspondence relation of which the upper and lower limits of the oscillation frequency are lowest, and if the control signal indicates a low level when the controlling value specifies the correspondence relation of which the upper and lower limits of the oscillation frequency are lowest, the controller outputs the controlling value specifying the correspondence relation of which the upper and lower limits of the oscillation frequency are highest.

4. A PLL circuit comprising:

a control voltage generator configured to generate a control voltage in accordance with a phase difference between a phase of an output signal fed back thereto and a phase of an input reference signal; and a voltage-controlled oscillator configured to control an oscillation frequency of the output signal in accordance with the control voltage, wherein the voltage-controlled oscillator includes:

an oscillator configured to have plural sets of upper and lower limits of the oscillation frequency and a plurality of control voltage-to-oscillation frequency correspondence relations correlated with a plurality of controlling values, respectively, the oscillator being configured to output the output signal with the oscillation frequency corresponding to the control voltage and associated with the correspondence relation specified by the controlling value, a threshold discriminator configured to generate a control signal indicating a relative level of the control voltage, and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, wherein, if the control signal indicates a high level when the controlling value specifies the correspondence relation of which the upper and lower limits of the oscillation frequency are highest, the controller outputs the controlling value specifying the correspondence relation of which the upper limit of the oscillation frequency is lower than and closest to a frequency of the reference signal, and if the control signal indicates a low level when the controlling value specifies the correspondence relation of which the upper and lower limits of the oscillation frequency are lowest, the controller outputs the controlling value specifying the correspondence relation of which the lower limit of the oscillation frequency is higher than and closest to the frequency of the reference signal.

5. A voltage-controlled oscillator for controlling an oscillation frequency of an output signal thereof in accordance with a control voltage generated based on a phase difference signal, the phase difference signal being generated by comparing a phase of an input reference signal with that of a frequency-divided signal obtained by dividing a frequency of the output signal, the voltage-controlled oscillator comprising:

an oscillator configured to have plural sets of upper and lower limits of the oscillation frequency and a plurality of control voltage-to-oscillation frequency correspondence relations being correlated with a plurality of controlling values, respectively, the oscillator being configured to output the output signal with the oscillation frequency corresponding to the control voltage and associated with the correspondence relation specified by the controlling value;

a threshold discriminator configured to generate a control signal indicating a relative level of the control voltage; and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, wherein, if the control signal indicates a high level when the controlling value specifies the correspondence relation of which the upper and lower limits of the oscillation frequency are highest, the controller outputs the controlling value specifying the correspondence relation of which the upper and lower limits of the oscillation frequency are lowest, and if the control signal indicates a low level when the controlling value specifies the correspondence relation of which the upper and lower limits of the oscillation frequency are lowest, the controller outputs the controlling value specifying the correspondence relation of which the upper and lower limits of the oscillation frequency are highest.

6. A voltage-controlled oscillator for controlling an oscillation frequency of an output signal thereof in accordance with a control voltage generated based on a phase difference signal, the phase difference signal being generated by comparing a phase of an input reference signal with that of a frequency-divided signal obtained by dividing a frequency of the output signal, the voltage-controlled oscillator comprising:

an oscillator configured to have plural sets of upper and lower limits of the oscillation frequency and a plurality of control voltage-to-oscillation frequency correspondence relations being correlated with a plurality of controlling values, respectively, the oscillator being configured to output the output signal with the oscillation frequency corresponding to the control voltage and associated with the correspondence relation specified by the controlling value;

a threshold discriminator configured to generate a control signal indicating a relative level of the control voltage; and a controller configured to output the controlling value in accordance with the control signal, the controller outputting a predetermined controlling value when either one of conditions below is fulfilled: (a) the control signal indicates a high level when the controlling value specifies the correspondence relation of which the upper and lower limits of the oscillation frequency are highest; and (b) the control signal indicates a low level when the controlling value specifies the correspondence relation of which the upper and lower limits of the oscillation frequency are lowest, wherein, if the control signal indicates a high level when the controlling value specifies the correspondence relation of which the upper and lower limits of the oscillation frequency are highest, the controller outputs the controlling value specifying the correspondence relation of which the upper limit of the oscillation frequency is lower than and closest to a frequency of the reference signal, and if the control signal indicates a low level when the controlling value specifies the correspondence relation of which the upper and lower limits of the oscillation frequency are lowest, the controller outputs the controlling value specifying the correspondence relation of which the lower limit of the oscillation frequency is higher than and closest to the frequency of the reference signal.

* * * * *